Figure 1:
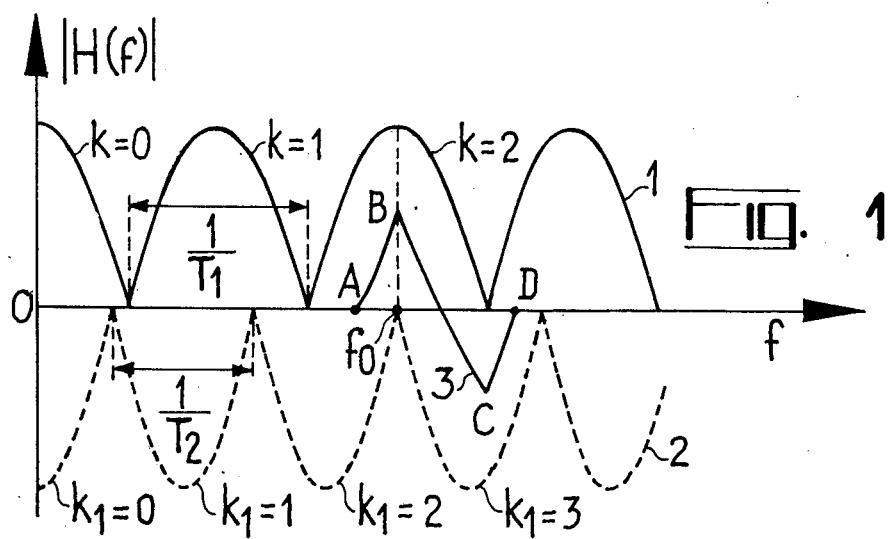

United States Patent [19]
Hartemann

[11] 3,987,367
[45] Oct. 19, 1976

[54] SURFACE WAVE DISCRIMINATOR SYSTEM

[75] Inventor: Pierre Hartemann, Paris, France

[73] Assignee: Thomson-CSF, Paris, France

[22] Filed: Aug. 20, 1974

[21] Appl. No.: 499,025

[30] Foreign Application Priority Data
Aug. 21, 1973  France .............................. 73.30304

[52] U.S. Cl. ................................ 329/118; 325/349; 325/487; 329/137; 329/145; 329/204; 333/30 R; 333/72
[51] Int. Cl.² .......................................... H03D 3/16
[58] Field of Search ........... 329/117, 118, 137, 145, 329/204; 333/30 R, 72; 331/29; 325/349, 487, 489

[56] References Cited
UNITED STATES PATENTS

| | | |
|---|---|---|
| 3,550,045 | 12/1970 | Adler ............................ 333/30 R X |
| 3,582,540 | 6/1971 | Adler et al. .................... 333/30 R X |
| 3,582,840 | 6/1971 | DeVries ......................... 333/30 R X |
| 3,626,309 | 12/1971 | Knowles ......................... 333/30 R X |
| 3,757,256 | 9/1973 | Whitehouse et al. ............. 333/30 R |
| 3,810,257 | 5/1974 | Jones et al. ..................... 333/30 R |
| 3,835,422 | 9/1974 | Hartemann ..................... 329/117 X |

*Primary Examiner*—Siegfried H. Grimm
*Attorney, Agent, or Firm*—Cushman, Darby & Cushman

[57] ABSTRACT

The invention relates to surface wave discriminator systems comprising a substrate on the surface of which are arranged two electromechanical filters each incorporating two delay lines of dissimilar delay length. The amplitudes of the alternating voltages transmitted by said filters obey laws of variation as a function of the modulating quantity which take the form of sinusoidal half waves, offset by a quarter of a period, making it possible after differential detection to obtain a frequency or phase discrimination characteristic.

13 Claims, 7 Drawing Figures

SURFACE WAVE DISCRIMINATOR SYSTEM

The present invention relates to frequency or phase discriminator systems of the kind used in particular to extract the information carried by an angularly modulated carrier wave, or to furnish the signal which in terms of magnitude and sign represents the deviation between the frequency or the phase of an arriving alternating signal and a frequency or a phase whose value is determined by the constituent elements of a discriminator device.

The invention relates more particularly to elastic surface wave discriminator systems which comprise two sets of electrodes forming, in relation to a piezoelectric substrate, propagation structures which are reproducible with precision and are sufficiently stable not to require any adjustments. In the field of elastic surface waves, it has been possible to construct discriminators using interdigital comb structures or relatively complex form in order to achieve the most linear possible discrimination characteristic. A more elementary electrode profile may provide entirely adequate linearity whilst at the same time substantially simplifying the design of elastic surface wave discriminators. Moreover, because of this simplification, it is possible to achieve a reasonable manufacturing cost with a reduction in bulk to the simplest level, coupled with high frequency operation.

Instead of employing electromechanical filters to ensure a linear variation in the transmitted amplitude with frequency, the invention proposes the use of filter structures of a much more elementary design, by means of which variations in the form of sinusoidal half waves are obtained, which, suitably combined, are capable of furnishing a discrimination curve of satisfactory linearity. It should be noted in passing that linearity is a feature which is not always required in many applications.

In accordance with the present invention, there is provided a surface wave discriminator system for demodulating an angularly modulated carrier waveform, said system comprising: a substrate, a pair of surface wave electromechanical filters arranged on the surface of said substrate, connecting means for simultaneously feeding said carrier waveform to the respective input terminals of said surface wave electromechanical filters, and differential amplitude detection means arranged for receiving the alternating signals appearing across the respective output terminals of said surface wave electromechanical filters; each of said surface wave electromechanical filters comprising two delay lines of dissimilar delay length; the launching and receiving transducers of said delay lines being positioned and electrically interconnected for providing within the discrimination range of said system a law of variation of the modulus of said alternating signals, as a function of the quantity causing the angular modulation of said carrier waveform, which is substantially a sinusoidal half wave; the sinusoidal half wave laws respectively arising from the behavior of said electromechanical filters being of identical amplitude and offset from one another by a quarter of the period of one of them the difference in delay length of said two delay lines being higher than a quarter wavelength of the surface wave travelling along said substrate.

Figure 2:
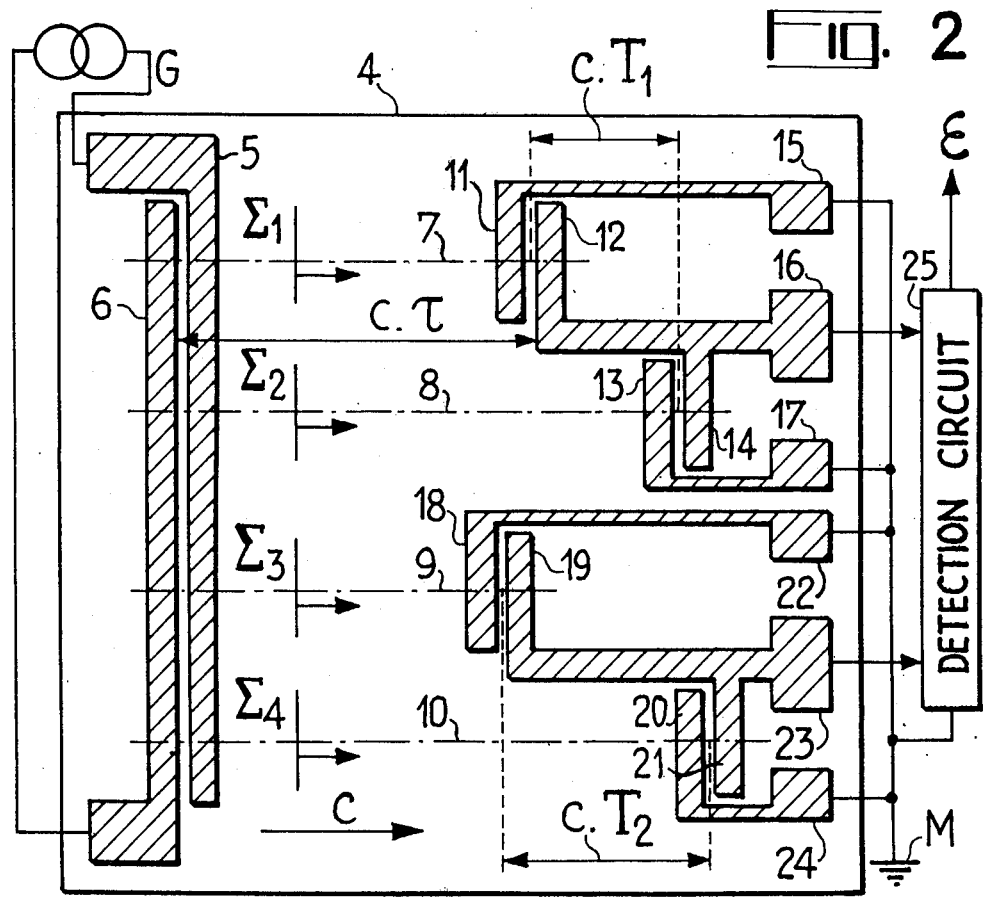
Figure 3:
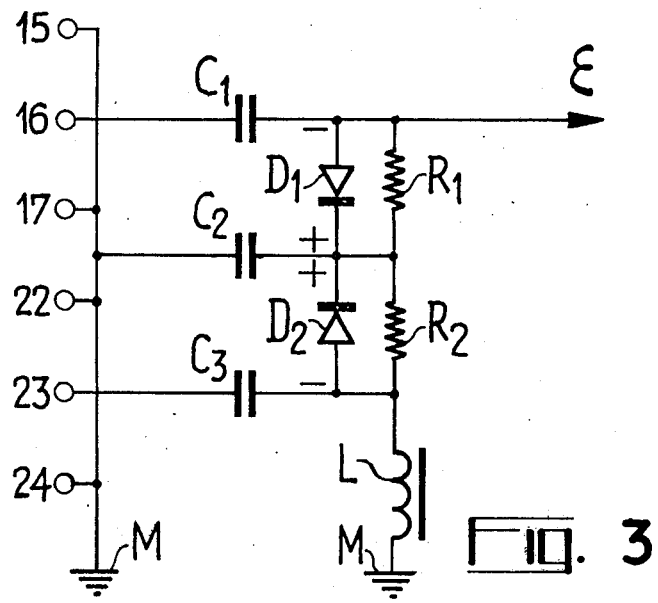
Figure 4:
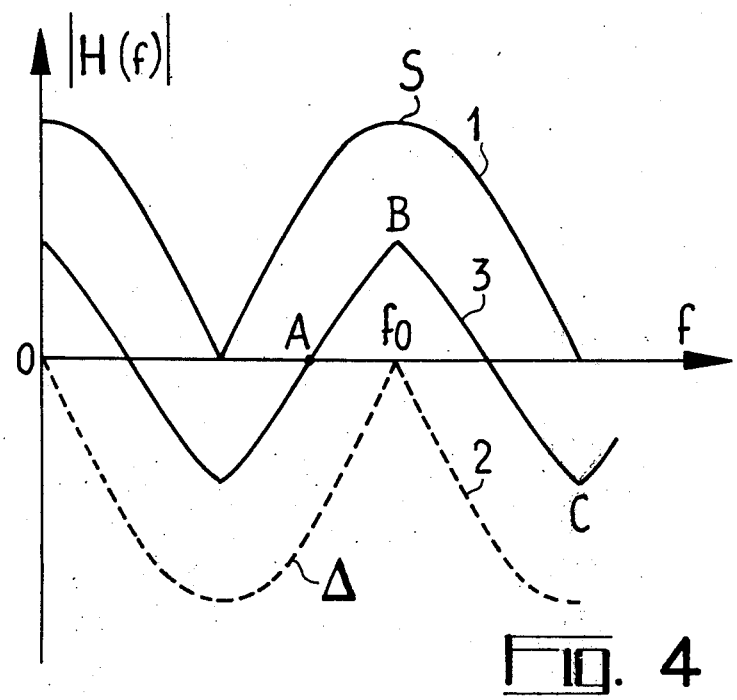
Figure 5:
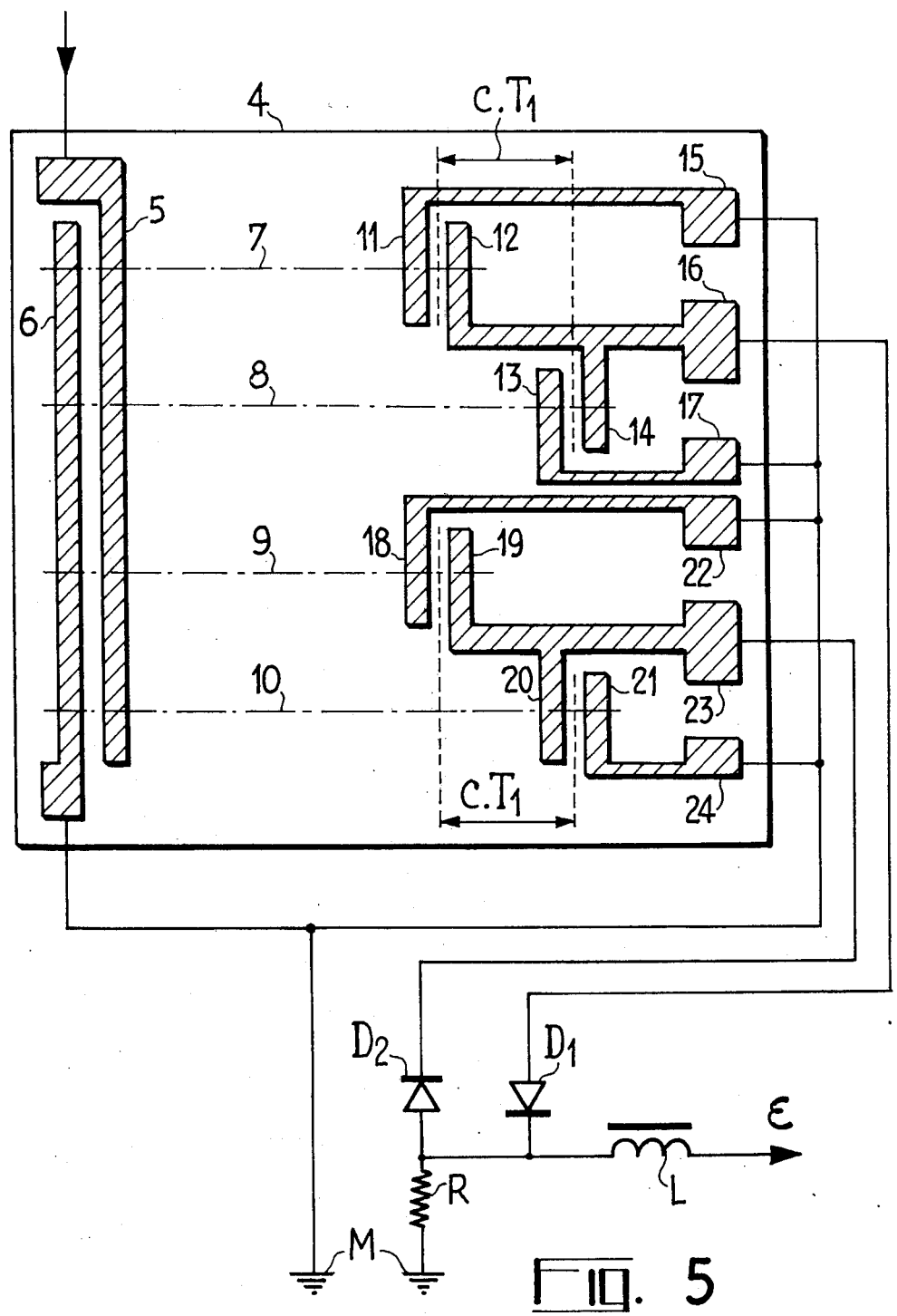
Figure 6:
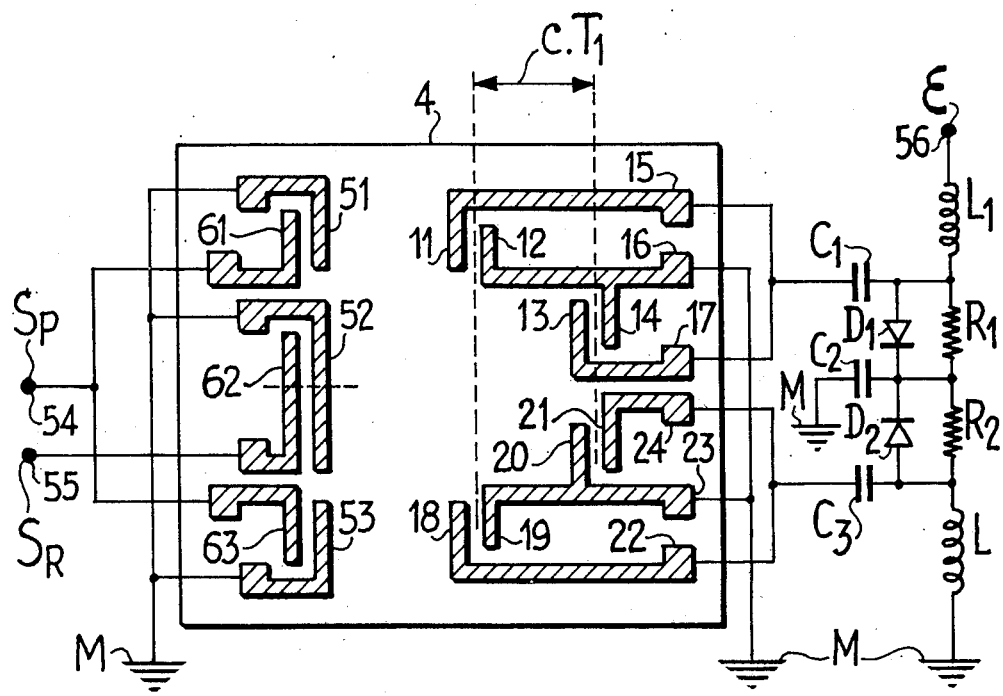
Figure 7:
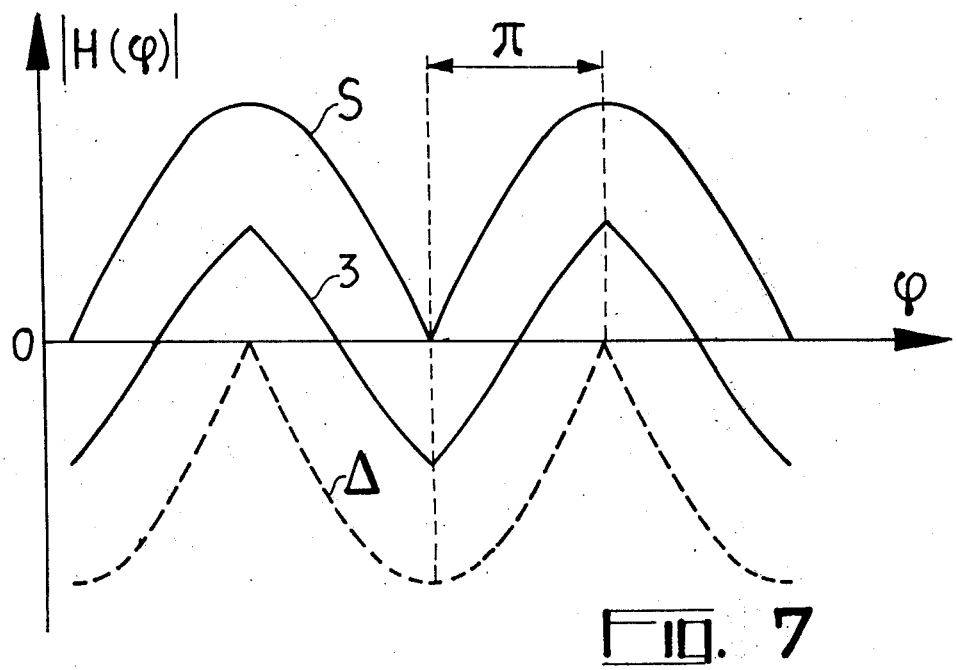

For a better understanding of the present invention, and to show how the same may be carried into effect reference will be made to the ensuing description and the attached figures among which:

FIG. 1 is an explanatory diagram.
FIG. 2 is a first example of a frequency discriminator in accordance with the invention.
FIG. 3 is an electrical diagram of differential electrical detection means employed in the device shown in FIG. 2.
FIG. 4 is an explanatory diagram.
FIG. 5 illustrates a second example of a frequency discriminator in accordance with the invention.
FIG. 6 illustrates a phase discriminator in accordance with the invention.
FIG. 7 is an explanatory figure.

In the ensuing description, the case of the frequency discriminator has been dealt with first in order to simplify the explanation of the invention. The case of the phase discriminator has been presented in the second part of the description.

The invention is based upon the transmission properties of a system comprising two delay lines of dissimilar delay length, $c.T$ and $c(T + T_1)$, to which, in the frequency discriminator version, there is simultaneously applied a signal of complex amplitude $A/2 . e^{j\omega t}$, in order that at a mixer element, the sum or difference of the transmitted signals can be picked off.

If we consider a pair of surface elastic wave delay lines, and noting that $c$ is the phase velocity of the propagated waves, then we find that one of the lines under consideration furnishes the signal $S_1 = A/2 . e^{j\omega(t-T)}$, with a delay of $T$, whilst the other line furnishes the signal $S_2 = A/2 . e^{j\omega(t-T-T_1)}$, with an extra delay of $T_1$.

The sum $S$ of the signals $S_1$ and $S_2$ can be expressed by the complex relationship:

$$S = A \cos \pi f T_1 \, e^{j\omega(t - T - T_1/2)}$$

where: $A$ is twice the complex amplitude of the input signal, $f$ its frequency and $\omega$ its angular frequency.

Similarly, the difference $\Delta$ between the signals $S_1$ and $S_2$ is expressed by the complex relationship:

$$\Delta = j A \sin \pi f T_1 \, e^{j\omega(t - T - T_1/2)}$$

where $j$ is the imaginary symbol.

An examination of these relationships shows that there is a cosinusoidal or sinusoidal amplitude variation as a function of the frequency $f$ of the resultant $H(f)$ which corresponds to the sum or difference of the waves transmitted by two delay lines.

The half period of this variation is equal to the reciprocal of the differential delay $T_1$ existing between the lines.

In FIG. 1, there has been plotted as a function of the frequency $f$, the variation in the modulus $|H(f)|$ of the resultant $S$, for a value $T_1$ on the part of the differential delay. This variation has been indicated by the graph 1 which is made up of cosine half waves commencing from the origin O. For a second value $T_2$ of the differential delay, there has likewise been shown in dotted line, the law of variation 2 of the sum $S$ although in order to make the drawing clearer, the graph has been shown in the negative part of the coordinate system. In addition, the plotting of these curves does not take into account the transmission characteristic of the launching and receiving transducers arranged at the two ends of each delay line. It goes without saying that a figure similar to FIG. 1 could be constructed, based not upon cosinusoidal half waves, but upon sinusoidal half waves; in this case, it will be necessary to consider that of the preceding relationships, which gives the result Δ.

Referring to FIG. 1, it will be seen that the half waves of the graph 1 reach their maximum value A when the frequency $f$ is equal to $k/t_1$, where $k$ is a whole number the successive values of which have been marked in FIG. 1 opposite the corresponding half waves. One of these special frequencies $f_0$ has been marked on the axis. The zero transits of the graph 1 take place when the frequency $f$ satisfies the condition:

$$f = \frac{2k+1}{2T_1}.$$

In the chosen example, $$f_0 = \frac{2}{T_1}$$

and the cosinusoidal half wave which commences at the frequency $f_0$ terminates at the frequency $$\frac{5}{2T_1}$$

since, as far as it is concerned $k$ is made equal to 2.

To obtain a discrimination characteristic, the invention proposes the subtraction from the half wave of the graph 1, whose peak occurs at the frequency $f_0$, of a half wave of the graph 2 which has a zero value at the frequency $f_0$. Thus, there is a shift of a quarter of a period between the two relevant half waves respectively carrying the references $k = 2$ and $k_1 = 3$.

The result of the subtraction operation is illustrated by the graph 3 which has a substantially linear portion BC representing the desired discrimination characteristic, and two extensions AB and CD having a slope of altered sign. The useful discrimination range BC is thus located between the frequency $f_0$ and the frequency $$f_0 + \frac{1}{2T_2}.$$

The zero transit upon the part of the graph 2 takes place when the frequency $f$ is equal to $$\frac{2k_1+1}{2T_2},$$

where $k_1$ is itself equal to $k + p$, $p$ being an arbitrary positive or negative whole number.

At the frequency $f_0$, thus the relationship linking the positions of the graphs 1 and 2, can be represented by the following double equation:

$$f_0 = \frac{K}{T_1} = \frac{2(k+p)+1}{2T_2}$$

The result is that the times $T_1$ and $T_2$ are linked with one another by the following relationship:

$$T_2 = T_1 + \frac{2p+1}{2f_0}$$

To obtain the best possible linearity on the part of the discrimination characteristic, the times $T_1$ and $T_2$ should differ from one another as little as possible so that advantageously, in this expression, $p = 0$ or $p = 1$ will be chosen; we then have:

$$T_2 = T_1 \mp \frac{1}{2f_0}$$

For the values $T_1$ and $T_2$ to differ from one another by as little as possible, $f_0$ should have a substantial value, and this comes down to making the numbers $k$ and $k_1$ relatively large. It should be noted that in FIG. 1 the following values were used, $k = 2$, $k_1 = 2$, and $p = 0$, these yielding a value $T_2$ greater than $T_1$ and situating the discrimination range beyond $f_0$. If $k = 2$, $k_1 = 1$ and $p = -1$, had been taken, the value of $T_2$ would have been less than $T_1$. It should also be noted that the effective discrimination range can equally well extend within the frequency $f_0$; in this case, the section AB should be extended downwards, giving a discrimination characteristic of reverse slope. Without departing from the scope of the invention, the graphs 1 and 2 could correspond respectively to two resultants of the type Δ or to a combinaison of an S-type resultant and a Δ-type resultant; the only important condition to be met is that the peak of one half wave should correspond with the zero transit in another, this being tantamount to the producing of a shift between them of a quarter of a period, or in other words $$\frac{1}{2T_1} \text{ or } \frac{1}{2T_2}.$$

The principle of operation illustrated by FIG. 1 is applied in FIG. 2 to a surface elastic wave frequency discriminator, comprising:

a piezoelectric substrate 4 at the surface of which four delay lines 7, 8, 9 and 10, grouped in pairs, have been outlined. These lines have a common launching transducer constituted by the deposition of two conductive electrodes 5 and 6 separated by an emissive rectilinear gap, the width of which is close to that of the electrodes. Under the action of the excitation voltage supplied by an electrical generator G, an inducing electric field is developed in that region of the substrate 4 which is located beneath the gap between the electrodes 5 and 6.

The result is the emission of elastic surface waves which propagate at the velocity $c$ in the form of four beams of vibrational energy $\Sigma_1$, $\Sigma_2$, $\Sigma_3$, $\Sigma_4$. Each of the lines terminates in a receiving transducer capable of converting the vibrational energy into electrical energy.

The line 7 comprises two electrodes 11 and 12 separated by an interval in which an electric field is developed under the action of the vibrational radiation $\Sigma_1$. The vibrational radiations $\Sigma_2$, $\Sigma_3$, $\Sigma_4$ are received in a similar fashion by the combtype transducers 13–14, 18–19 and 20–21.

The interval c.t separating the comb transducer 5–6 from comb 11–12, is responsible for the transmission of the signal furnished by the generator, with a delay of t. the additional interval $c.T_1$ given to the comb 13–14, ensures that the line 8 has a differential delay $T_1$ which is added to the delay of the line 7. The lines 9 and 10 and the combs 18–19 and 20–21 are designed to introduce a differential delay $T_2$ greater than $T_1$. The electrodes 11 and 13 are taken to earth M via the output terminals 15 and 17, whilst the electrodes 12 and 14 are connected to a common terminal 16 which furnishes the sum S of the signals induced by the vibrational radiations $\Sigma_1$ and $\Sigma_2$.

In the same way, the electrodes 18 and 20 are connected to earth M through the medium of the terminals 22 and 24; the terminal 23, connected to the electrodes 19 and 21, is the location of a signal representing the sum S of the signals induced by the vibrational radiations $\Sigma_3$ and $\Sigma_4$.

A two-input detection circuit 25 is supplied with the alternating signals coming from the terminals 16 and 23, in order to detect them; after detection, the amplitudes of these signals vary in accordance with the graphs 1 and 2 of FIG. 1, and all that remains is to subtract them in order to produce an error signal $\Sigma$ the amplitude of which varies in accordance with the graph 3 of FIG. 1. The spacing between the teeth of the transducer comb is chosen so that their pass band is centred on the effective discrimination range.

In FIG. 3, a differential amplitude detection circuit designed to operate in association with the surface wave device of FIG. 2, can be seen. The input terminals 15, 16, 17, 22, 23 and 24 are for connection to the output terminals carrying the same references, in FIG. 2. The terminal 16 is connected by a capacitor $C_1$ to the anode of a diode $D_1$, and the cathode of the diode $D_1$ is earthed across a capacitor $C_2$; a diode $D_2$ connected in opposition to the diode $D_1$ at the point of connection of $C_2$, has its anode connected across a capacitor $C_3$ to the terminal 23. Load resistors $R_1$ and $R_2$ are shunted across the diode $D_1$ and $D_2$ and the anode of the diode $D_2$ is earthed across a choke L.

The alternating voltage appearing between the terminal 16 and the earth M, is rectified by the diode $D_1$ and appears at its terminal with the polarities indicated in FIG. 3. The same applies to the alternation voltage between the terminal 23 and earth; this rectified voltage appears at the terminals of the diode $D_2$. The anode of the diode $D_2$ being earthed across the choke L, at the anode of the diode $D_1$, a voltage $\Sigma$ proportional to the difference between the rectified voltages which reverse-bias the diodes $D_1$ and $D_2$, is obtained. The resistors $R_1$ and $R_2$ pass the electrical charges developed on the capacitors $C_1$, $C_2$ and $C_3$. It is possible to utilise another method of connection which consists in connecting the terminals 16 and 23 to earth and in connecting the terminals 15 and 17 to the capacitor $C_1$, the terminals 22 and 24 to the capacitor $C_3$.

In the foregoing description, we have seen that two half waves were made to occur in relation to one another in such a fashion that they are off-set from one another on the frequency axis by a quarter of a period. In order for the widths of these half waves to be virtually the same, the order of K must be high because the interval between $T_1$ and $T_2$ is equal at a minimum to $1/2 fo$.

The discriminator of FIG. 2 is made up of fact of two surface wave electromechanical filters each comprising a pair of delay lines the electrical interconnections between which can be arranged in order to furnish the sum $S$ or the difference $\Delta$ of the signals transmitted by the lines.

If the two pairs of delay lines have precisely the same configuration as far as the position of the launching and receiving intervals are concerned, then the differential delays $T_1$ and $T_2$ will be equal. In order to differentiate the two filters, it is contrived that the electrodes which define a receiver interval in one of the filters, have their connections changed over in relation to the connections to these same electrodes in the other filter. This simple change-over has the effect of producing at the output terminals of one of the filters a sum signal whose value $S$ has been explained hereinbefore, and at the output terminals of the other filter a difference signal whose value $\Delta$ has likewise been taken into account in the foregoing.

In the diagram of FIG. 4, the graphs 1 and 2 signify the variations of the modulus $|H(f)|$ of the amplitude of the signals $S$ and $\Delta$ in the case just described. The dotted sinusoidal half waves and the full-line cosinusoidal half waves, have exactly the same pitch and are off-set by precisely a quarter of a period. The graph 3 representing the difference of the rectified amplitudes of the signals $S$ and $\Delta$, has a saw-tooth form each portion of which, such as that BC, can be used as a discrimination characteristic.

In FIG. 5, a variant embodiment of the frequency discriminator shown in FIG. 2 can be seen, in which the two pairs of delay lines produce the same differential delay $T_1$. The references used are the same as those employed in FIG. 2 but it should be pointed out that the electrodes 20 and 21 instead of being connected in the manner of the electrodes 13 and 14, have their connections changed over. The result is that the signal furnished between the terminals 16 and 15–17, is the sum S of the signals transmitted by the lines 7 and 8, whilst the signal furnished between the terminals 23 and 22–24 is the difference $\Delta$ between the signals transmitted by the delay lines 9 and 10. The output terminals 15, 16, 17, 22, 23, 24 can be connected to a differential detection circuit such as that shown in FIG. 3. In FIG. 5, another differential detection circuit has been shown, this time comprising a resistor R connected to the earth M and passing the positive current alternations, transmitted by the diode $D_1$ and the negative ones transmitted by the diode $D_2$; a choke $L$ is responsible for the transmission of the mean value $\Sigma$ of voltage developed across the terminals of the resistor R. This mean value $\Sigma$ is proportional to the difference between the rectified alternating amplitudes of the respective voltages applied to the diodes $D_1$ and $D_2$; it constitutes the discrimination signal whose variation as a function of the frequency $f$ conforms with the graph 3 of FIG. 4. The case of the phase discriminator can be understood from the explanations provided in relation to the frequency discriminator. It is necessary to distinguish two signals applied to the input terminals of the discriminator: the carrier wave incorporates a phase modulation $\phi$ and can be defined by the relationship:

$$S_p = \frac{A}{2} \cdot e^{j(\omega t - \phi)} ;$$

the reference wave $S_R$ which determines the phase origin, is in turn expressed by the relationship:

$$S_R = \frac{A}{2} e^{j\omega t}$$

in which two expressions the angular frequency $\omega$ is constant and the phase angle $\phi$ is a function of time.

The modification to be made to the discriminator described earlier in order to make it act as a phase discriminator, consists in forming two groups with the transmitter transducers of the four delay lines.

In FIG. 6, by way of non-limitative example a phase discriminator similar to the discriminator of FIG. 5 but modified by the splitting of the transmitter transducer 5, 6 into two groups, can be seen.

The four receiver transducers carry the same references as in FIG. 5 and are designed in the same way. The differential detection circuit is the same as that shown in FIG. 3 but the output voltage representing the variation of the phase $\phi$ is transmitted via an additional filtering inductor $L_1$. The modification is concerned primarily with the launching tranducers which are constituted in FIG. 6 by a central comb 52, 62 and by two lateral combs 51, 61 and 53, 63; and these latter are connected to the common terminal 54 and to the earth M.

The signal $S_p$ whose phase is to be discriminated is applied to the terminal 54 in order to emit two adjacent beams of elastic surface waves, respectively in the direction of the comb 11, 12 and 18, 19. The phase reference signal $S_R$ is applied by the terminal 54 to the comb 52, 62 in order to transmit an elastic surface wave beam the halves of which are picked up by the combs 13, 14, and 20, 21.

The operation of the phase discriminator shown in FIG. 6 is illustrated in FIG. 7 which latter plots as a function of the phase-shift $\phi$ between the signals $S_R$ and $S_R$, the modulus $|H(\phi)|$ of the rectified voltages appearingg across the terminals of the resistors $R_1$ and $R_2$. The graph S relates to the voltage available at the terminals of the resistor $R_1$, and the graph $\Delta$, plotted in the negative part of the coordinate system, relates to the voltage appearing across the terminals of the resistor $R_2$. The graph 3, which for the sake of clarity has been shown at half scale, translates the variation in the voltage $\epsilon$ available between the output terminals 65 and the earth M.

Making $CT_1$ equal, for example, to an odd multiple of a quarter of the wavelength $\lambda$ of the elastic surface waves, it will be seen that the voltage $\epsilon$ disappears when the phase-shift $\phi$ is a multiple of $\pi$. It will be seen, therefore, that the phase discrimination range can cover an interval of width M as indicated in FIG. 7. The device shown in FIG. 6 can be connected in the same fashion as that of FIG. 5, if it is desired to operate it as a frequency discriminator.

What I claim is:

1. Surface wave discriminator system for demodulating an angularly modulated carrier waveform, said system comprising: a substrate, a pair of surface wave electromechanical filters arranged on the surface of said substrate, connecting means for simultaneously feeding said carrier waveform to the respective input terminals of said surface wave electromechanical filters, and differential amplitude detection means arranged for receiving the alternating signals appearing across the respective output terminals of said surface wave electromechanical filters; each of said surface wave electromechanical filters comprising two delay lines of dissimilar delay length; the launching and receiving transducers of said delay lines being positioned and electrically interconnected for providing within the discrimination range of said system a law of variation of the modulus of said alternating signals, as a function of the quantity causing the angular modulation of said carrier waveform, which is substantially a sinusoidal half wave; the sinusoidal half wave laws respectively arising from the behaviour of said electromechanical filters being of identical amplitude and offset from one another by a quarter of the period of one of them; the difference in delay length of said two delay lines being higher than a quarter wavelength of the surface wave travelling along said substrate.

2. System as claimed in claim 1, wherein the difference in delay length of the delay lines, constituting one of said surface wave electromechanical filters, differs from the difference in delay length of the delay lines constituting the other of said surface wave electromechanical filters.

3. System as claimed in claim 1, wherein the difference in the delay lengths of the lines respectively belonging to said surface wave electromechanical filters, are identical.

4. System as claimed in claim 1, wherein for frequency demodulation, said substrate is cut from a piezoelectric material; the launching transducers of said delay lines being combined in a single launching transducer comprising two conductive bands deposited upon the surface of said substrate and separated from one another by an emissive gap having an axis perpendicular to the axes of propagation of said delay lines; the receiving transducers of said delay lines each comprising two conductive electrodes deposited upon the surface of said substrate and separated from one another by a reception gap having an axis perpendicular to the axis of propagation of the corresponding delay line; interconnecting means being provided for connecting the electrodes of said receiving transducers to said output terminals.

5. System as claimed in claim 3, wherein in one of said surface wave electromechanical filters, the receiving transducers of said delay lines are interconnected for supplying the sum of the delayed signals respectively transmitted by said delay lines; in the other of said surface wave electromechanical filters, the receiving transducers of said delay lines being interconnected for supplying the difference of the delayed signals respectively transmitted by said delay lines.

6. System as claimed in claim 1, wherein said differential amplitude detection means comprise two diode detector circuits supplied respectively by said output terminals; the voltage rectified by said detector circuits being subtracted from one another; the output terminals of said detector circuits being series connected.

7. System as claimed in claim 1, wherein said differential amplitude detector means comprise two rectifier diodes respectively connected to said output terminals for producing in a common load resistor currents constituted by the positive half waves coming from one of said surface wave electromechanical filters, and by the negative half waves coming from the other of said surface wave electromechanical filters.

8. System as claimed in claim 1, wherein the axes of said delay lines are arranged parallel to one another on said substrate; the transducers of said delay lines being constituted by interdigital comb-type conductor structure delimiting at least one interval capable of radiating said surface waves in a frequency band covering said discrimination range.

9. System as claimed in claim 8, wherein the teeth of said comb-type conductor structures are rectilinear and parallel with one another.

10. System as claimed in claim 1, wherein for phase demodulation, said substrate is cut from a piezoelectric material; the launching transducers of said delay lines forming two separate groups; one of said groups simultaneously supplying one of the receiving transducers of said delay lines belonging to each of said surface wave electromechanical filters; the other of said groups simultaneously supplying the other of the receiving transducers of said delay lines belonging to each of said surface wave electromechanical filters; the receiving transducers of said delay lines being connected to said output terminals.

11. System as claimed in claim 10, wherein in one of said groups, said launching transducers form a single launching transducer.

12. System as claimed in claim 10, wherein said transducers are constituted by electrodes taking the form of comb structures; each of said comb structures delimiting at least one rectilinear radiating interval.

13. System as claimed in claim 12, wherein the radiating intervals of the launching transducers are aligned.

* * * * *